United States Patent [19]

Popovic et al.

[11] Patent Number: 5,247,202
[45] Date of Patent: Sep. 21, 1993

[54] PLURALITY OF ARRANGEMENTS EACH INCLUDING AN IC MAGNETIC FIELD SENSOR AND TWO FERROMAGNETIC FIELD CONCENTRATORS, AND A PROCEDURE FOR INCORPORATING EACH ARRANGEMENT INTO A PACKAGE

[75] Inventors: Radivoje Popovic, Zug; Jan Hrejsa, Oberwil, both of Switzerland

[73] Assignee: Landis & Gyr Betriebs AG, Zug, Switzerland

[21] Appl. No.: 955,926

[22] Filed: Oct. 2, 1992

[30] Foreign Application Priority Data

Oct. 9, 1991 [CH] Switzerland .............. 02979/91

[51] Int. Cl.⁵ .................................. H01L 23/54
[52] U.S. Cl. ................................ 257/677; 257/666
[58] Field of Search ............... 257/666, 677; 437/217, 437/220, 206; 361/421

[56] References Cited

U.S. PATENT DOCUMENTS 3,900,813  8/1975  Masuda et al. .............. 257/665
5,138,431  8/1992  Huang et al. ............... 257/677

Primary Examiner—Rolf Hille
Assistant Examiner—S. V. Clark
Attorney, Agent, or Firm—Meltzer, Lippe, Goldstein et al.

[57] ABSTRACT

In an embodiment of the invention, a magnetic sensor comprises an IC magnetic flux sensor and two magnetic flux concentrators (18,19) which are each a section of a ferromagnetic lead frame. A section (18b) of a first magnetic flux concentrator (18), a semiconductor chip (4) and a section (19b) of a second magnetic flux concentrator create a sub-unit (18b;4;19b) having three sandwich like layers (I,II,III). A further section (18a) of first magnetic flux concentrator (18) is a sheet metal object having the shape of a single staircase-like step. The step exhibits a first surface section (22) and a second surface section (23) parallel thereto. One side of first surface section (22) is disposed on top of semiconductor chip (4) in the first layer (I). Second surface section (23) and semiconductor chip (4) are disposed in the second layer (II). A section (17) of a non-ferromagnetic lead frame mounting semiconductor chip (4) and the second magnetic flux concentrator (19) are disposed in the third layer (III). The configuration can without difficulty be assembled and packaged in a conventional assembly line, whereby expensive alignment operations during assembly and the occurrence of relatively large and inaccurate air-gaps can be avoided.

6 Claims, 5 Drawing Sheets

PLURALITY OF ARRANGEMENTS EACH INCLUDING AN IC MAGNETIC FIELD SENSOR AND TWO FERROMAGNETIC FIELD CONCENTRATORS, AND A PROCEDURE FOR INCORPORATING EACH ARRANGEMENT INTO A PACKAGE

FIELD OF THE INVENTION

The invention relates to an arrangement that includes a magnetic field sensor in the form of an integrated circuit (IC) semiconductor chip, as well as a first and second magnetic flux concentrator. The invention also relates to a method for incorporating plastic package (hereinafter the word arrangement is used generically as referring to several different configurations or embodiments of the invention). The arrangement preferably serves the purpose of measuring a magnetic field H, which acts in the vicinity of the semiconductor chip.

BACKGROUND OF THE INVENTION

Such an arrangement is known from the publication *Technisches Messen tm* 56 (1989) 11, pp.436–443, entitled "Aufbautechniken für Halbleiter-Magnetfeldsensoren," by W. Heidenreich. The arrangement described in the foregoing publication is structured in the form of a hybrid circuit in which a first magnetic flux concentrator is a ferrite substrate and another magnetic field concentrator is a ferrite cube. The latter is glued on the active location of a Hall element that has the form of a cross.

OBJECT OF THE INVENTION

The object of the invention is to improve the well-known arrangement in a manner that it can be readily assembled and packaged by means of conventional assembly line methods used in the manufacture of integrated circuits (IC's without costly alignment operations during assembly. The invention further eliminates large and inaccurate air gaps, which as a rule are present with hybrid integrated circuits and have a negative influence on the sensitivity of the magnetic field sensor.

SUMMARY OF THE INVENTION

The object of the invention is achieved by introducing two magnetic flux concentrators as being integral parts of lead frames. The number of lead frames is more than one, and the sensitive semiconductor Hall element or chip is mounted on said lead frames. The arrangement in its various embodiments is such that it is always amenable to be assembled and packaged in plastic housings by merely using conventional assembly line and packaging methods used in the manufacture of integrated circuits.

BRIEF DESCRIPTION OF THE DRAWINGS

All elements appearing in the drawings are referred to by the same reference numbers in all drawings.

DETAILED DESCRIPTION

Figure 1:
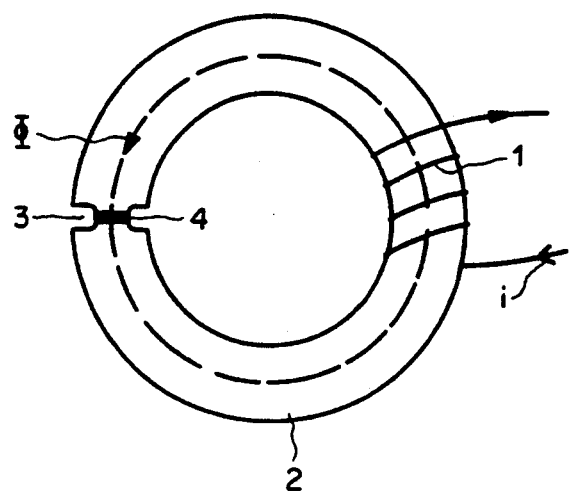
FIG. 1 shows a conventional magnetic field sensor system being inserted into the gap of a magnetic core.

As is shown e.g. in FIG. 1, a magnetic field H to be measured is generated by means of an alternating current i that is flowing in a coil surrounding a ferromagnetic core 2. The magnetic field H appears in an air gap of core 2. The alternating current i generates a magnetic flux $\Phi$. A semiconductor wafer in which the magnetic field sensor is integrated (and will hereinafter be designated as semiconductor chip 4) is inserted in air gap 3 of ferromagnetic core 2. The dimension of the width of said air gap 3 is as a rule substantially larger than the dimension of the cross-section of semiconductor chip 4. For this reason, when precision measurements must be made, the pole faces of ferromagnetic core 2 are each provided with a magnetic flux concentrator of ferromagnetic material having the e.g. shape of a funnel (not shown in FIG. 1). The two magnetic field concentrators concentrate the magnetic flux $\Phi$ that is available in ferromagnetic core 2 onto a relatively small area of semiconductor chip 4 sensitive to the magnetic field. The magnetic field sensor is preferably a Hall element.

Figure 2:
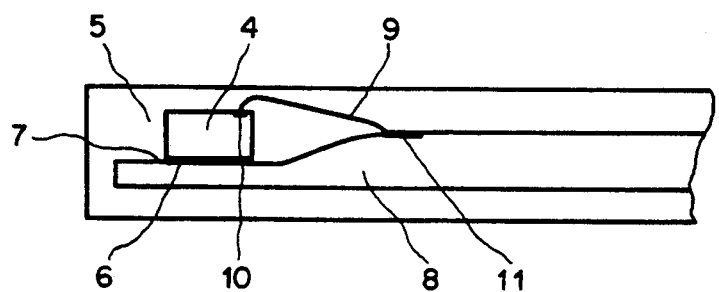
FIG. 2 shows a mechanical structure of a semiconductor integrated magnetic field sensor incorporated in a plastic package.

FIG. 2 shows the mechanical structure of a semiconductor chip 4 packaged in a plastic package 5 well-known in IC technology. Semiconductor chip 4 is mounted and secured on a surface 7 by means of an adhesive 6, or a welding or soldering process. Surface 7 which is a section of a surface acting as a connecting tape or strip (hereinafter designated a lead frame), is made out of sheet metal. The latter can be e.g. a material which is either itself a good electric conductor like copper, or is covered with a layer of good electric conducting material like silver. Furthermore, fine gold wire are available as connecting bond wires 9. At their one end, connecting wires 9 are connected to be electrically well conductive by using e.g. thermocompression to connect them to contact surface 10 of semiconductor chip 4. At their other end, and under similar conditions, connecting wires 9 are connected to a contact surface of lead frame 8. After semiconductor chip 4 is mounted on lead frame 8, and after the connection of connection wires 9 is made, the entire configuration is dipped in plastic to thereby obtain plastic package 5.

Figure 3:
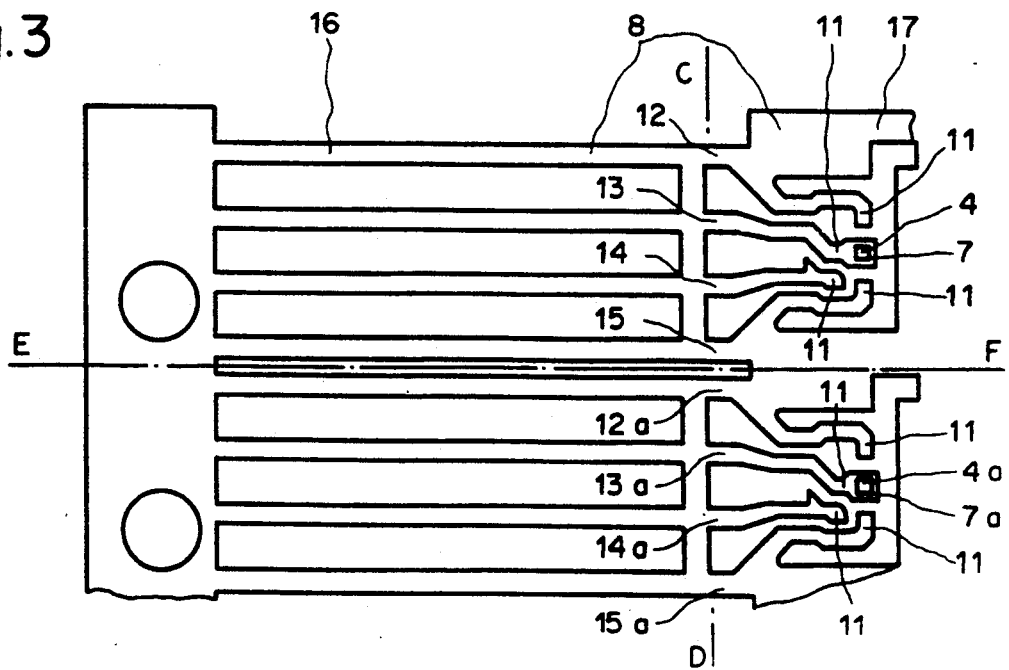
FIG. 3 is a plan view of a section of a conventional set of lead frames mounting a plurality of semiconductor chips, used in the mass production of integrated Hall elements.

In practice, during the mass production of IC's, a plurality of identical semiconductor chips 4 are mounted on a lead frame 8, which then has the structure of a long metallic tape. FIG. 3 shows a partial plan view of a lead frame 8, in which two surfaces 7 and 7a can be seen each mounting semiconductor chips 4 and 4a respectively. Connecting wires 9 are not shown in FIG. 3 for reasons of clarity. They are however present and connected to both semiconductor chips 4 and 4a. When semiconductor chip 4 or 4a only contains a single Hall element, then four external connections for each semiconductor chip 4 or 4a are available as can be seen from FIG. 3. The connections are made to terminals representing two current input terminals and two sensor-output terminals. When each semiconductor chip 4 or 4a is mounted in a DIL-pack (Dual-in-line pack), then each of the four connecting links to semiconductor 4 or 4a has the form of any of the metal leads 12,13,14,15 or respectively metal leads 12a,13a,14a, or 15a, and is connected to make good electrical contact with a surface 11 also belonging to lead frame 8. It should be noted that contact surface 11 and the metal leads 12-15 as well as leads 12a-15a and all their attendant electrical connections are generated in lead frame 8. This can be done e.g. by punching out a proper format from lead frame 8, or by etching out undesirable material from the latter.

After all the semiconductor chips 4, 4a, etc. which were mounted on lead frame 8 and provided with metal leads have each been enclosed in a plastic package 5, a section 16 of lead frame 8 which is no longer needed is being cut off along a cut-off line CD. At the same time, the individually packaged semiconductor chips 4, 4a, etc. are being mechanically separated from each other along several cut-off lines EF. In FIG. 3, the section 16 which represents the part of lead frame 8 which is no longer needed is located to the right of cutting line CD. On the other hand, the section that retains a packed configuration for each semiconductor chip and belongs to section 17 of lead frame 8 is shown to be located to the right of cutting line CD. Cutting line CD thus runs approximately along an outer edge of metal leads 12-15 and 12a-15a, whereas cutting line EF runs between adjacent configurations, perpendicularly to cutting line CD.

Semiconductor chip 4 or 4a may be combined with other electronic components besides the magnetic sensor or Hall element to form a single integrated circuit (IC). In such a case, more than four metal leads (12-15 or 12a-15a) are available per semiconductor chip 4 or semiconductor chip 4a. In such a case, all metal leads are preferably arrayed in two parallel rows. In such packaged arrangement all metal leads are additionally bent by a 90° angle, to thereby obtain the conventional metal leads associated with a DIL package (DIP).

The three arrangements shown in FIGS. 4–9, which are three embodiments according to the invention, all include a magnetic field sensor integrated in a semiconductor chip 4, a first ferromagnetic magnetic flux concentrator 18, and a second ferromagnetic magnetic flux concentrator 19. Semiconductor chip 4 is mounted in each case on a section 17 which is a section of a first lead frame 8 that has been introduced for the purpose of packaging semiconductor chip 4 according to the invention. Lead frame 8 is made out of metal sheet. The two magnetic flux concentrators 18 and 19 have each the shape of a funnel in a plan view, to each of which are associated trapezoidal sections 18a or 19a respectively as well as rectangular sections 18b and 19b respectively. In the configuration of the drawing, the funnel-like structures are rotated by 180° with respect to each other. In practice, however, they can be rotated with respect to each other by any other angle. The rectangular sections 18b and 19b of the funnel-like structures are configured to be partially overlapping. Section 18b of first magnetic flux concentrator 18, semiconductor chip 4 and section 19b of second magnetic flux concentrator 19 are configured to at least partially lie on each other in the sequence indicated above, in a manner in which the section that is sensitive to the magnetic field of semiconductor chip 4 lies at least between both sections 18b and 19b. In such an arrangement, a sub-unit 18b;4;19b is created sandwiched in three layers I, II, III. Magnetic flux concentrator 18 is part of a second lead frame 20, and magnetic flux concentrator 19 is part of a third lead frame 21. Second lead frame 20 and third lead frame 21 which are introduced in order to fulfill the function of packaging semiconductor chip 4 are only shown in FIG. 10 but do not appear in FIGS. 4–9. They are ferromagnetic and made of sheet metal. Section 17 of first lead frame 8 which mounts semiconductor chip 4, appears in at least one or two of the three layers I, II, III of sandwich like sub-unit 18b;4;19b.

Figure 4:
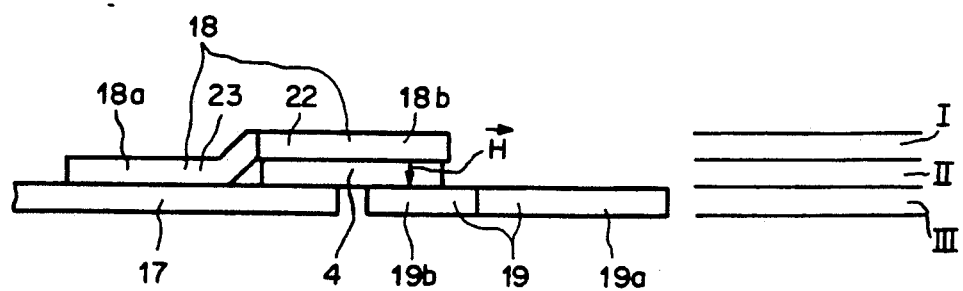
FIG. 4 is a cross-section of a simplified schematic representation of a first embodiment of an arrangement according to the invention.
Figure 5:
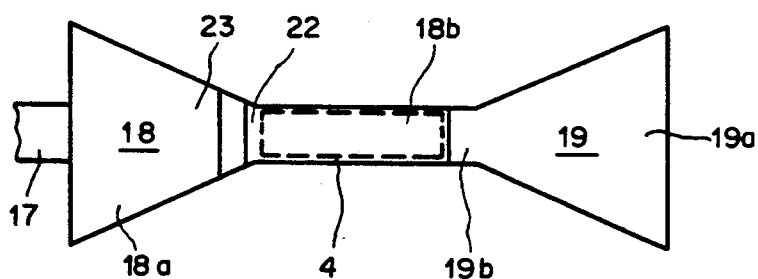
FIG. 5 is a plan view of a simplified schematic representation of said first embodiment according to the invention.

In an arrangement representing a first embodiment of the invention as shown in FIGS. 4 and 5, a section of an element of the embodiment, e.g., section 18a of first magnetic flux concentrator 18 is folded along two parallel lines so as to create a sheet metal object having the shape of a single staircase-like step. Such a step exhibits a first surface section 22 and a second surface section 23 parallel thereto. First surface section 22 is disposed on top of semiconductor chip 4 with the plane of contact facing second surface section 23. Thus surface section 22 lies in layer I of sandwiched sub-unit 18b;4;19b. Second surface section 23 and semiconductor chip 4 are located in second layer II. Furthermore, according to the invention, section 17 of first lead frame 8 and section 19 of the third lead frame 21 (i.e., the second magnetic flux concentrator) appear in layer III of sandwich like sub-unit 18b;4;19b.

Figure 6:
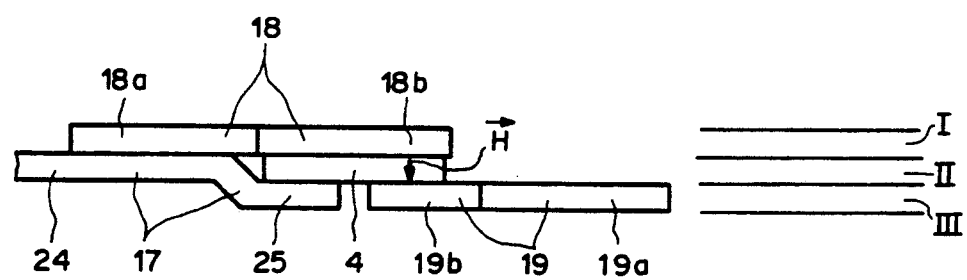
FIG. 6 is a cross-section of a schematic representation of a second embodiment according to the invention.
Figure 7:
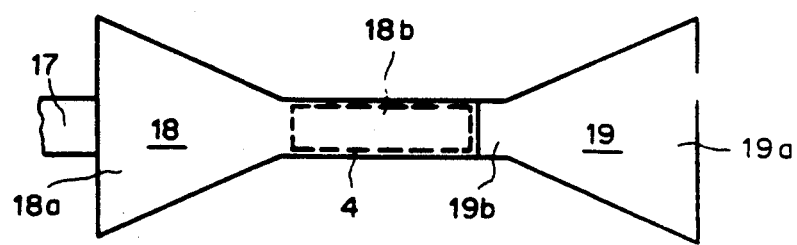
FIG. 7 is a plan view of a simplified schematic representation of said second embodiment according to the invention.

In the second embodiment of the invention as indicated in FIGS. 6 and 7, a section 18 of the second ferromagnetic lead frame 20 is according to the invention disposed in layer I of sandwich like sub-unit 18;4;19b. Section 17 of first lead frame 8 is, according to the invention, folded along two parallel lines such as to create a sheet metal object having the shape of a single staircase-like step. Such a step exhibits a first surface section 24 and a second surface section 25, parallel thereto. First surface section 24 and semiconductor chip 4 are disposed in layer II of sandwich like sub-unit 18b;4;19b. One of the planes of second surface section 25 which faces first surface 24 mounts semiconductor chip 4, whereas second surface section 25 and a section 19 that according to the invention belongs to third ferromagnetic lead frame 21, are disposed in the third layer III of sandwich like sub-unit 18b;4;19b.

Figure 8:
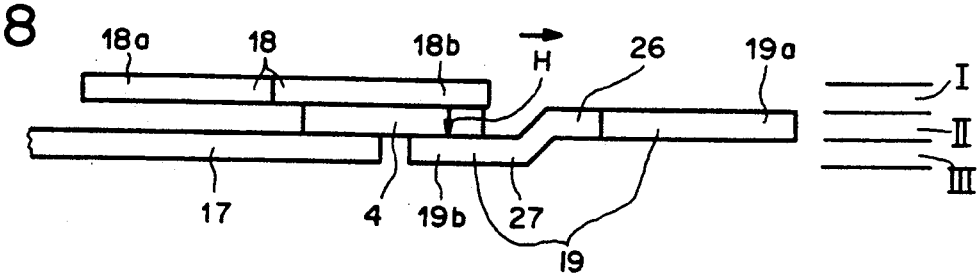
FIG. 8 is a cross-section of a simplified schematic representation of a third embodiment according to the invention.
Figure 9:
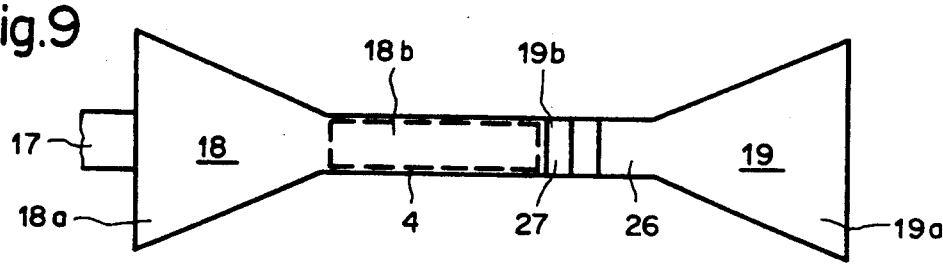
FIG. 9 is a plan view of a simplified schematic representation of said third embodiment according to the invention.
Figure 10:
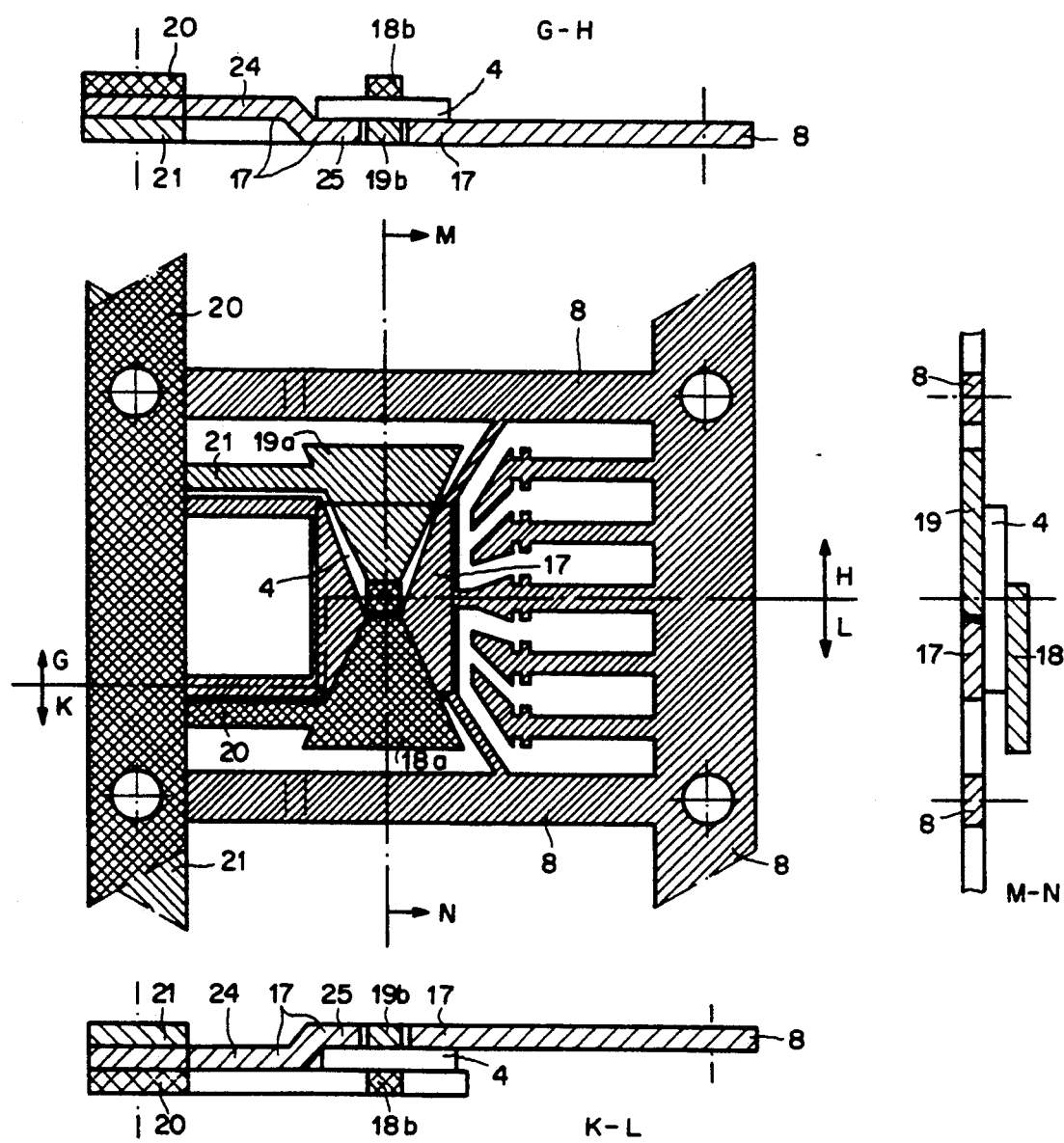
FIG. 10 shows a plan view as well as three cross-sections G-H, K-L and M-N of a detailed representation of the second embodiment with due regard to assembly and packaging.

In the third embodiment of the arrangement according to the invention as shown in FIGS. 8 and 9, a section 18 of the second ferromagnetic lead frame 20 is disposed according to the invention in first layer I of sandwich like sub-unit 18b;4;19b. Section 19b of third ferromagnetic lead frame 21 is according to the invention folded along two parallel lines such as to create a sheet metal object having the structure of a single staircase-like step. Such a step exhibits a first surface section 26 and a second surface section 27 parallel thereto. First surface section 26 and semiconductor chip 4 are disposed in layer II of sandwich like sub-unit 18b;4;19b. One of the planes of section 17 of first lead frame 8 that faces surface section 26, mounts semiconductor chip 4 in the arrangement according to the invention. Finally, according to the invention, second surface section 27 of section 19b of third ferromagnetic lead frame 21 and section 17 of first lead frame 8 are disposed in the third layer III of sandwich line sub-unit 18b;4;19b.

In FIGS. 4, 6 and 8 of section 17 of first lead frame 8 and magnetic flux concentrator 19 which is only a section of third ferromagnetic lead frame 21 are shown for reasons of simplicity, as appearing to lie next to each other in layer III. In practice, sections 17 and 19 can be configured to be interleaved and thus made to appear only in layer III. This is further clarified in FIG. 10 for the second embodiment of the arrangement according to the invention. Clearly, from cross-section G-H it can be seen that section 17 is being disposed to the right and to the left of section 19b of magnetic flux concentrator 19, because section 17 exhibits a U-shaped structure in a plan view.

A method for providing an enclosure in a plastic package for each of the foregoing embodiments according to the invention consists preferably in that after assembling a plurality of semiconductor chips 4 on each of a corresponding section 17 of the first lead frame 8, the second ferromagnetic lead frame 20, first lead frame 8, third ferromagnetic lead frame 21 are superposed on each other in sandwich like manner in the indicated order and pressed together against each other. Subsequently, the semiconductor chip 4 of each arrangement together with the adjacent sections 17,18,19 of the three lead frames 20, 8 and 21 belonging to the particular embodiment at hand, are sprayed with or cast in plastic material so as to each be imbedded in a plastic package. Finally, the individual packaged units are mechanically separated from each other by eliminating the superfluous and non-packaged section 16 of the three lead frames 20, 8, 21.

The structures resulting from the arrangements according to the invention can thus be assembled and packaged in large quantities without difficulty by means of conventional assembly line and packaging methods used in the manufacturing of integrated circuits. Clearly, the procedure adopted for incorporating structures resulting from the invention into plastic packages differs only from the procedure used in conventional assembly lines in that during packaging, instead of using a single lead frame 8, three parallel lead frames 8, 20 and 21 lying on each other and pressed against each other are being used. In a different vein, a situation may arise in which the foregoing sheet metal objects in the form of staircase-like steps are inserted in an interleaved manner in the empty space gaps of one or several adjacent lead frames. The plastic material which is sprayed or cast under pressure to create plastic package 5 presses together remaining sections 18, 19, 17 (including semiconductor chip 4 mounted thereon) of lead frames 20, 21, and 8, according to the invention. As a result, only relatively small and well-defined air gaps 3 are available. With the exception of the latter, all other available cavities in the unit according to the invention are filled with plastic.

In the three first embodiments and in the fifth embodiment of the arrangement according to the invention, first lead frame 8 is made of non-ferromagnetic material.

Figure 11:
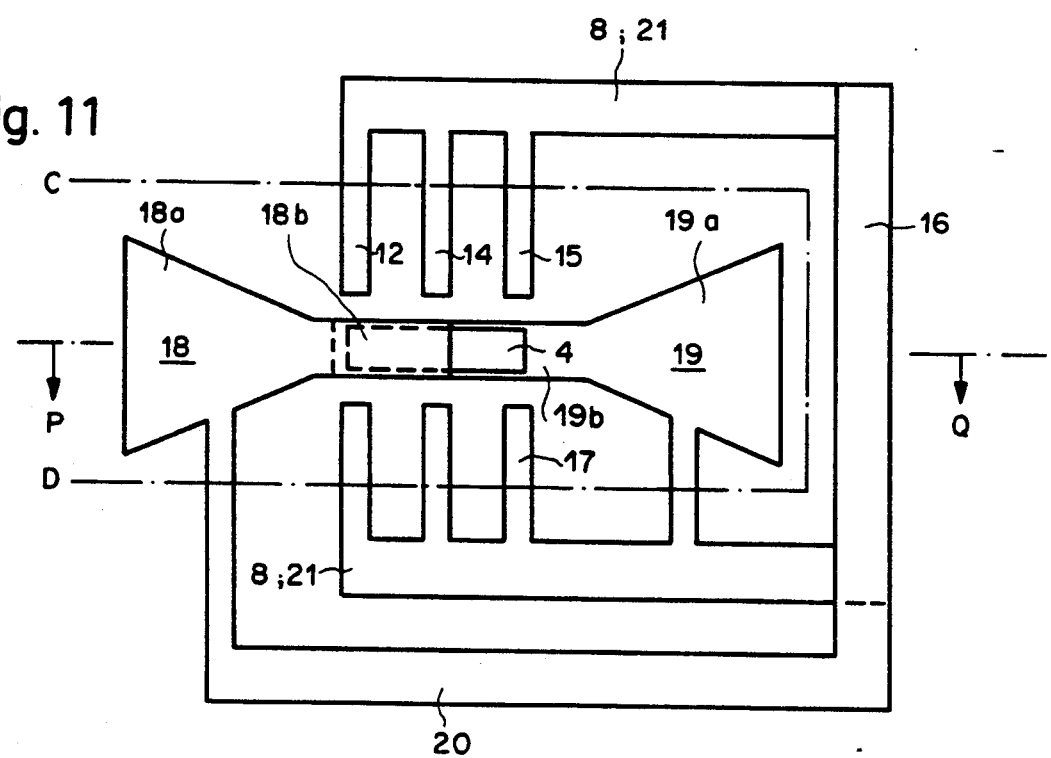
FIG. 11 is a plan view of a simplified schematic representation of a fourth embodiment of an arrangement according to the invention.
Figure 12:
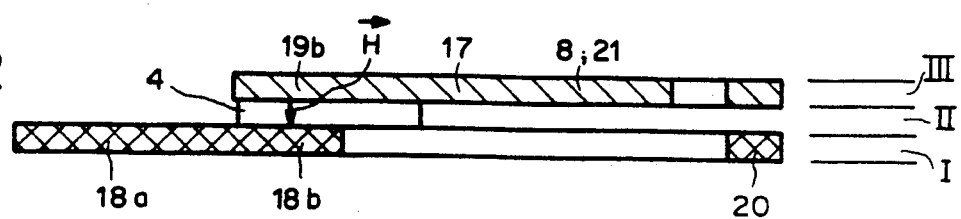
FIG. 12 is a cross-section of a simplified schematic representation of said fourth embodiment according to the invention.

In the fourth embodiment according to the invention, as shown in FIGS. 11 and 12, sandwich like sub-unit 18b;4;19b is again included. In this embodiment first lead frame 8 is made of ferromagnetic material and at the same time takes over the function of third lead frame 21, so that it is hereafter designated as 8;21. As a result, first lead frame 8;21 includes not only metal leads 12,14 and 15 of the basic element structural element and the surface mounting semiconductor chip 4, but also second magnetic flux concentrator 19, which now becomes a section of first lead frame 8;21. However, first magnetic flux concentrator 18 is a section of second ferromagnetic lead frame 20, the latter being made out of sheet metal. First layer I of the arrangement contains section 17 of first lead frame 8;21, said section 17 staying in the arrangement, whereas layer II contains semiconductor chip 4, and layer III contains the section that remains part of second lead frame 20.

Figure 13:
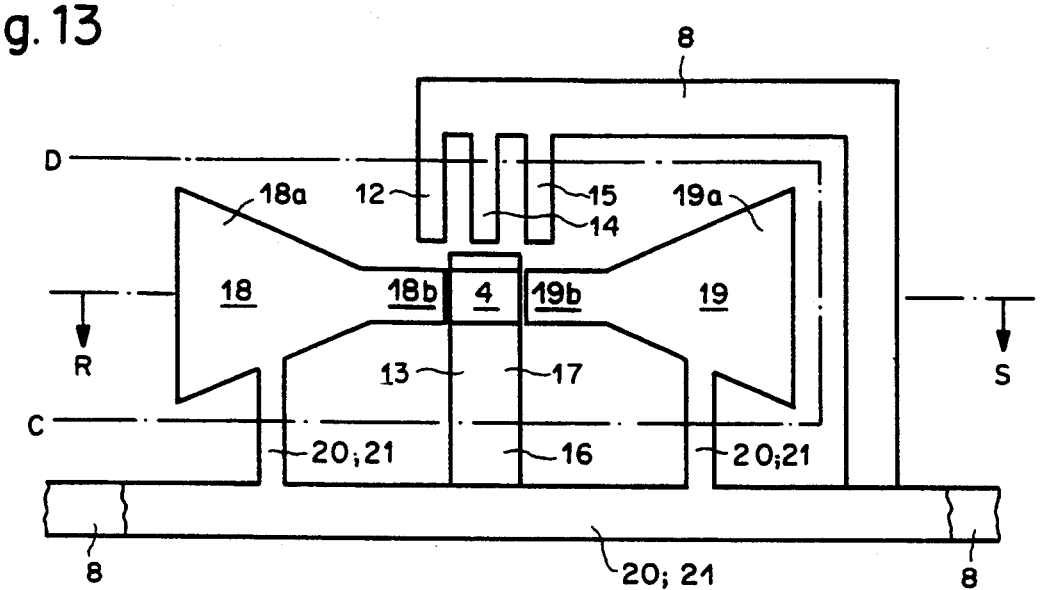
FIG. 13 is a plan view of a simplified schematic representation of a fifth embodiment of an arrangement according to the invention.
Figure 14:
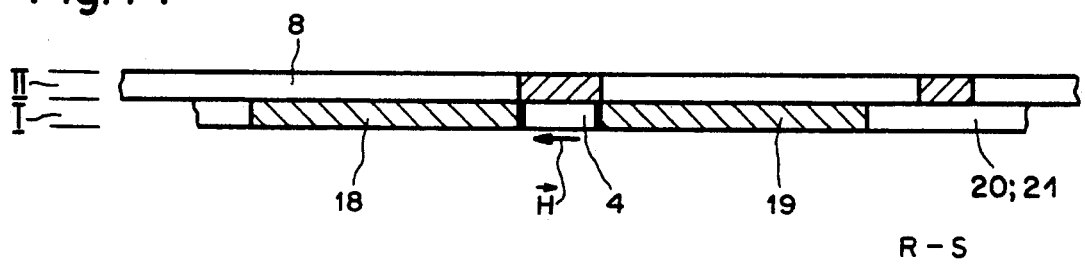
FIG. 14 is a cross-section of a simplified schematic representation of said fifth embodiment of an arrangement according to the invention.

In the fifth embodiment of the invention represented in FIGS. 13 and 14, section 18b of first magnetic flux concentrator 18, semiconductor chip 4 and section 19b of second magnetic flux concentrator 19 are disposed in a single layer I at least adjacent to each other and in the sequence enumerated above. Lead frame 8 is made of non ferromagnetic material for the case at hand. Its section 17, which stays in the arrangement, is contained in a layer II that is parallel to layer I. The two magnetic flux concentrators 18 and 19 are sections of a single ferromagnetic lead frame 20;21 made out of sheet metal.

In the first four embodiments the magnetic field sensor was to measure a magnetic field H that is perpendicular to semiconductor 4 in the vicinity thereof. In the fifth embodiment, to the contrary, the magnetic field sensor is to measure a magnetic field H that is parallel to the surface of semiconductor chip 4 in the vicinity thereof.

FIGS. 11 and 13 include a cutting line CD, along which the packaged individual assembly units are being separated from each other as the last step of their manufacture.

The procedure for incorporating a plurality of individual structures that appear in the fourth or fifth embodiment into a plastic package consists in that after assembling a plurality of semiconductor chips 4 of a section 17 belonging to either first lead frame 8 or 8;21, the latter and second ferromagnetic lead frame 20 or 20;21 are disposed in sandwich like fashion on one another and pressed together. This operation takes place before the actual packaging operation in which a semiconductor chip 4 belonging to a particular structure is imbedded in the plastic material of each plastic package 5 together with the particular section 17, 18, 19 adjoining the two lead frames 20 and 8;21 or respectively 8 and 20;21. Subsequently, the packaged individual structures are separated mechanically from each other by eliminating the non packaged section of both lead frames 20 and 8; 21 and respectively 8 and 20;21.

Finally, the embodiments of the invention described in the foregoing are merely illustrative. Numerous alternative embodiments may be devised by a person skilled in the art without departing from the scope of the following claims.

We claim:

1. A Device comprising
   a magnetic field sensor incorporated in an integrated circuit semiconductor chip (4),
   a first lead frame (8) made out of metal sheet said first lead frame including a section (11) for mounting said semiconductor chip (4),
   a second lead frame (20) made out of ferromagnetic metal sheet including as a section a first ferromagnetic magnetic flux concentrator (18) said magnetic flux concentrator including a first section (18b),
   a second ferromagnetic magnetic flux concentrator (19) formed from a section of a lead frame made of ferromagnetic metal sheet, said second magnetic flux concentrator including a first section (19b),
   said device being configured so that said first section of said first magnetic flux concentrator lies on top of said semiconductor chip, the latter lying on top of said first section of said second magnetic flux concentrator to form a sandwich-like sub-unit (18b;4;19b) with first, second and third layers (I, II, III),
   wherein said section of said first lead frame for mounting said semiconductor chip (4) is disposed such as lie in one of said layers or in two of said layers (III, II, or II and III), said device further comprising
   a third lead frame (21) made out of ferromagnetic material including as a section said second ferromagnetic magnetic flux concentrator (19) whereby said first lead frame (8) is made out of non-ferromagnetic material.

2. The device according to claim 1 comprising
   a second section (18a) of said second lead frame wherein
   said second section is folded along two parallel lines so as to create a sheet metal object having the shape of a single staircase-like step, said step exhibiting a first surface section (22) and a second surface section (23) parallel thereto and wherein said device is configured so that said first section (22) is disposed on top of said semiconductor chip (4) and thereby lying in said first layer (I) of said sandwiched sub-unit (18b;4;19b), said device being further configured so that said second surface section 23 and said semiconductor chip (4) are located in said second layer (II) of said sandwiched sub-unit (18b;4;19b), said device being further configured so that said section (17) of said first lead frame (8) and said section (19) of said third ferromagnetic lead frame (21) are located in said third layer (III) of said sandwiched sub-unit (18b;4;19b).

3. The device of claim 1 wherein said device is configured so that said section (18) of said second ferromagnetic lead frame (20) is located in said first layer (I) of said sandwiched sub-unit (18b;4;19b) and wherein said section (17) of said first lead frame (8) is folded along two parallel lines such as to create a sheet metal object having the shape of a single staircase-like step, said step exhibiting a first surface section (24) and a second surface section (25) parallel thereto and wherein said device is configured so that said first surface section (24) and said semiconductor chip (4) are disposed in said second layer (II) of said sandwiched sub-unit (18b;4;19b) said device being further configured so that said second surface section (25) mounts said semiconductor chip (4) whereas said second surface section (25) and said section (19) of said third ferromagnetic lead frame (21) are disposed in said third layer (III) of said sandwiched sub-unit (18b;4;19b).

4. The device of claim 1 where said device is configured so that said section (18) of said second lead frame (20) is located in said first layer (I) of said sandwiched sub-unit (18b;4;19b) and wherein said first section (19b) of said third ferromagnetic lead frame (21) is folded along two parallel lines such as to create a sheet metal object having the structure of a single staircase-like step, said step exhibiting a first surface section (26) and a second surface section (27) parallel thereto and wherein said device is configured so that said first surface section (26) and said semiconductor chip (4) are disposed in said second layer (II) of said sandwiched sub-unit (18b;4;19b), said device being further configured so that said second surface section (27) of said first section of said third ferromagnetic lead frame (21) and said section (17) of said first lead frame (8) are disposed in said third layer III of said sandwiched sub-unit (18b;4;19b).

5. A device comprising
   a magnetic field sensor incorporated in an integrated circuit semiconductor chip (4),
   a first lead frame (8) made out of metal sheet said first lead frame including a section (17) for mounting said semiconductor chip (4),
   a second lead frame (20) made out of ferromagnetic metal sheet including as a section a first ferromagnetic magnetic flux concentrator (18) said magnetic flux concentrator including a first section (18b),
   a second ferromagnetic magnetic flux concentrator (19) formed from a section of a lead frame made of ferromagnetic metal sheet, said second magnetic flux concentrator including a first section (19b),
   said device being configured so that said first section of said first magnetic flux concentrator lies on top of said semiconductor chip, the latter lying on top of said first section of said second magnetic flux concentrator to form a sandwich-like sub-unit (18b;4;19b) with first, second and third layers (I, II, III),
   wherein said section of said first lead frame for mounting said semiconductor chip (4) is disposed such as lie in one of said layers or in two of said layers (III, II, or II and III), and
   wherein said first section (18b) of said first magnetic flux concentrator (18), said semiconductor chip (4) and said first section (19b) of said second magnetic flux concentrator (19) are at least partially arrayed to be adjacent to each other in said first layer (I), said first and second magnetic flux concentrators (18,19) being sections of said second lead frame (20;21) made out of ferromagnetic sheet metal, whereby said first lead frame (8) is non-ferromagnetic.

6. A device comprising
   a magnetic field sensor incorporated in an integrated circuit semiconductor chip (4),
   a first lead frame (8) made out of metal sheet, said first lead frame including a section (17) for mounting said semiconductor chip (4), a second lead frame (20) made out of ferromagnetic metal sheet including as a section a first ferromagnetic magnetic flux concentrator (18) said magnetic flux concentrator including a first section (18b), a second ferromagnetic magnetic flux concentrator (19) formed from a section of a lead frame made of ferromagnetic metal sheet, said second magnetic flux concentrator including a first section (19b), said device being configured so that said first section (18b) of said first magnetic flux concentrator, said semiconductor chip, and said first section (19b) of aid second magnetic flux concentrator all are in a single layer (I).

* * * * *